United States Patent
Sudo et al.

(10) Patent No.: US 9,758,900 B2
(45) Date of Patent: Sep. 12, 2017

(54) SILICA GLASS CRUCIBLE

(71) Applicant: SUMCO Corporation, Minato-ku, Tokyo (JP)

(72) Inventors: Toshiaki Sudo, Akita (JP); Tadahiro Sato, Akita (JP); Ken Kitahara, Akita (JP); Takuma Yoshioka, Akita (JP); Hiroshi Kishi, Akita (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 14/369,151

(22) PCT Filed: Oct. 31, 2012

(86) PCT No.: PCT/JP2012/078257
§ 371 (c)(1),
(2) Date: Jun. 26, 2014

(87) PCT Pub. No.: WO2013/099431
PCT Pub. Date: Jul. 4, 2013

(65) Prior Publication Data
US 2015/0027364 A1    Jan. 29, 2015

(30) Foreign Application Priority Data
Dec. 30, 2011    (JP) .................. 2011-290478

(51) Int. Cl.
*C30B 15/10*    (2006.01)
*C03B 19/09*    (2006.01)
(Continued)

(52) U.S. Cl.
CPC ............ *C30B 15/10* (2013.01); *C03B 19/095* (2013.01); *C30B 11/002* (2013.01); *C30B 29/06* (2013.01);
(Continued)

(58) Field of Classification Search
CPC ..... C30B 15/10; C30B 35/002; C30B 11/002; C03C 15/00
(Continued)

(56) References Cited

U.S. PATENT DOCUMENTS 6,280,522 B1 *    8/2001    Watanabe ............. C03B 19/095
                                                                117/29
2003/0012898 A1 *    1/2003    Kemmochi ............... B32B 5/16
                                                                428/34.4
(Continued)

FOREIGN PATENT DOCUMENTS

JP    H08-301693 A    11/1996
JP    2002-226291 A    8/2002
(Continued)

OTHER PUBLICATIONS

International Search Report (ISR) for PCT/JP2012/078257; dated Dec. 18, 2012.

*Primary Examiner* — Matthew Song
(74) *Attorney, Agent, or Firm* — Law Office of Katsuhiro Arai

(57) ABSTRACT

Buckling of a vitreous silica crucible 12 or inward fall of a sidewall 15 is effectively suppressed. The vitreous silica crucible 12 includes the cylindrical sidewall 15 having an upward-opening rim, a mortar-shaped bottom 16 including a curve, and a round portion 17 connecting the sidewall 15 and the bottom 16. In the vitreous silica crucible 12 the per-unit area thermal resistance in the thickness direction of the sidewall 15 is higher than that of the round portion 17.

6 Claims, 3 Drawing Sheets

(51) Int. Cl.
  *C30B 35/00* (2006.01)
  *C30B 11/00* (2006.01)
  *C30B 29/06* (2006.01)

(52) U.S. Cl.
  CPC ....... *C30B 35/002* (2013.01); *Y10T 117/1032* (2015.01)

(58) Field of Classification Search
  USPC .......................... 117/200, 208, 213, 13, 900
  See application file for complete search history.

(56) References Cited

U.S. PATENT DOCUMENTS

| | | |
|---|---|---|
| 2005/0178319 A1 | 8/2005 | Korus et al. |
| 2010/0162947 A1 | 7/2010 | Harada et al. |
| 2012/0137965 A1* | 6/2012 | Sudo .................... C03B 19/095 117/208 |

FOREIGN PATENT DOCUMENTS

| | | | | |
|---|---|---|---|---|
| JP | 2002-284596 A | 10/2002 | | |
| JP | 2004-067452 A | 3/2004 | | |
| JP | 2005-523229 A | 8/2005 | | |
| JP | 2008-273788 A | 11/2008 | | |
| JP | 2010-155760 A | 7/2010 | | |
| JP | EP 2248776 A1 * | 11/2010 | ............. | C30B 15/10 |
| JP | 2011-121842 A | 6/2011 | | |
| WO | 00/06811 A1 | 2/2000 | | |
| WO | 2011/013695 A1 | 2/2011 | | |

\* cited by examiner

[FIG.1]
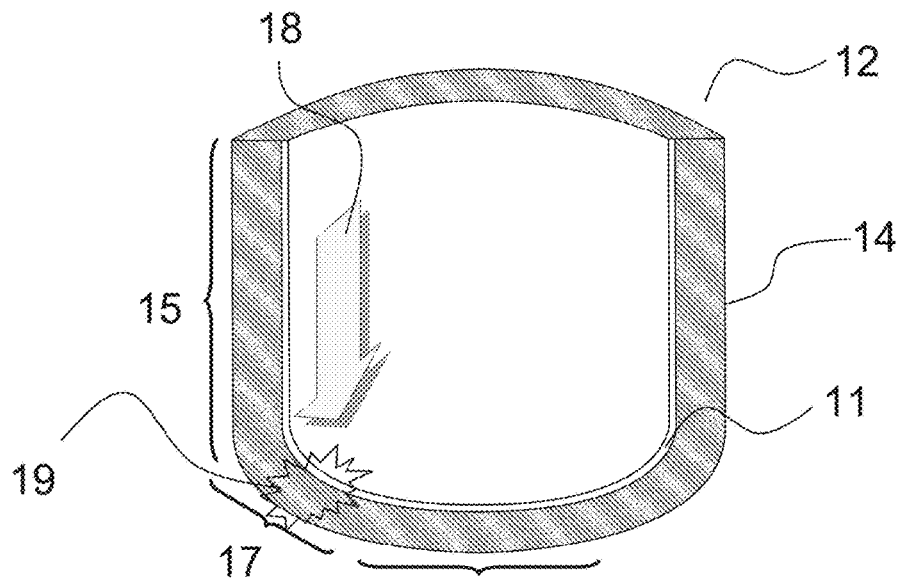
[FIG.2]
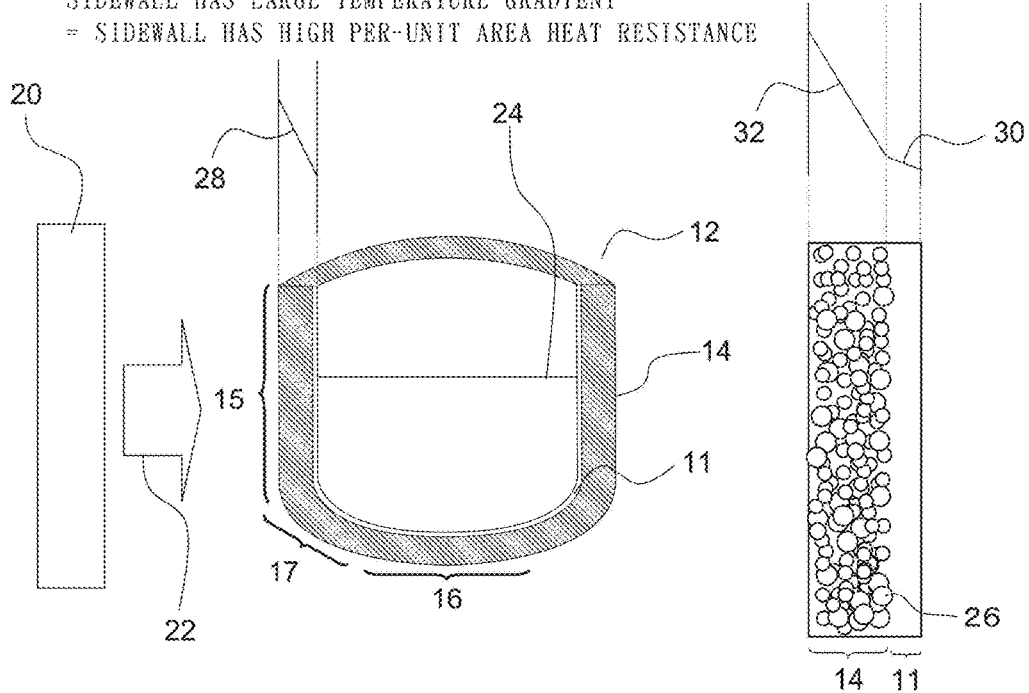
SIDEWALL HAS LARGE TEMPERATURE GRADIENT
= SIDEWALL HAS HIGH PER-UNIT AREA HEAT RESISTANCE

[FIG.3]
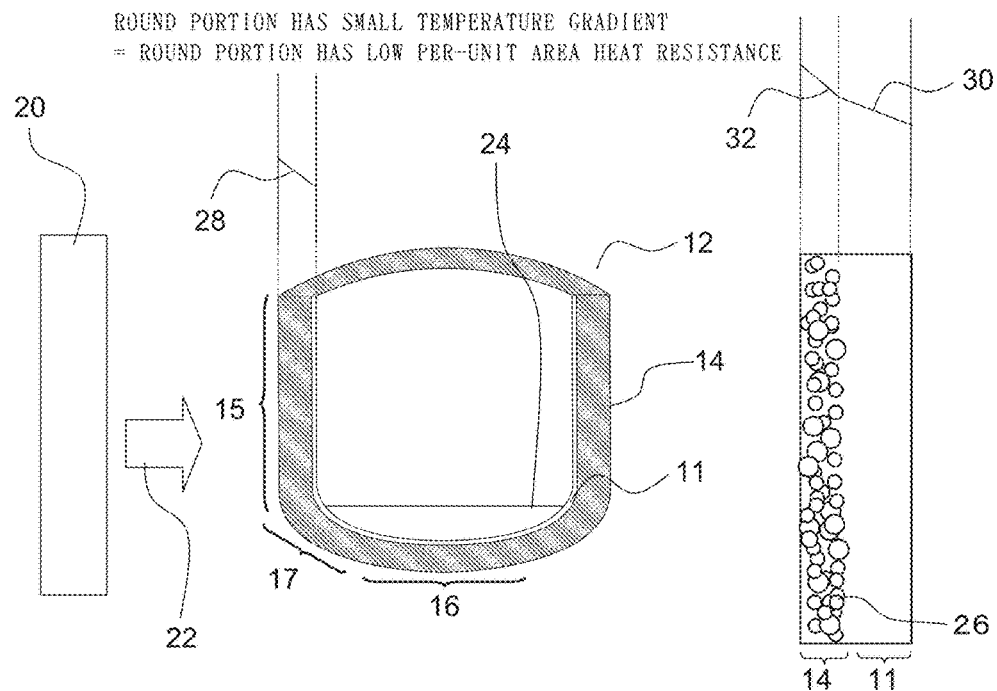
[FIG.4]
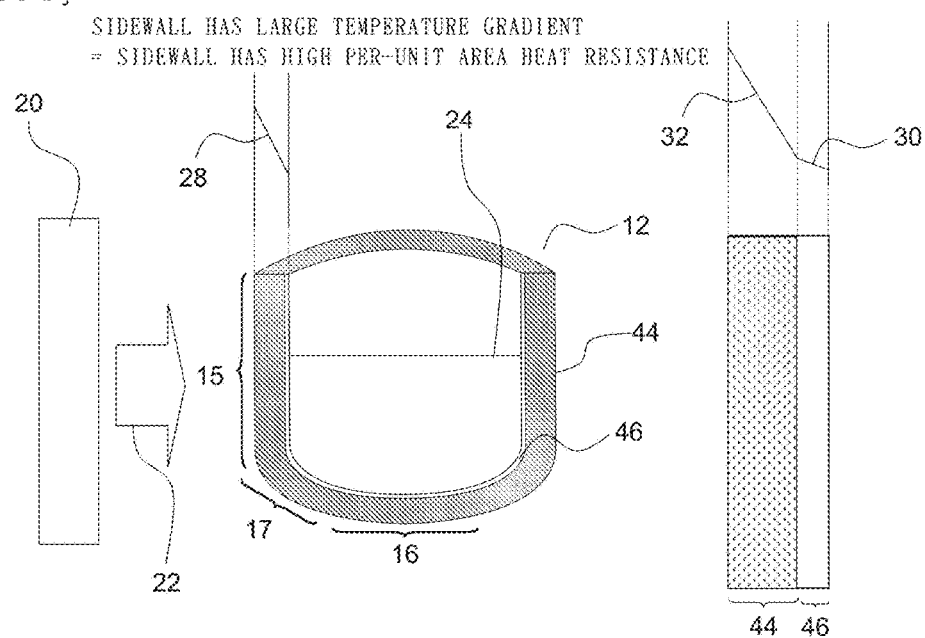

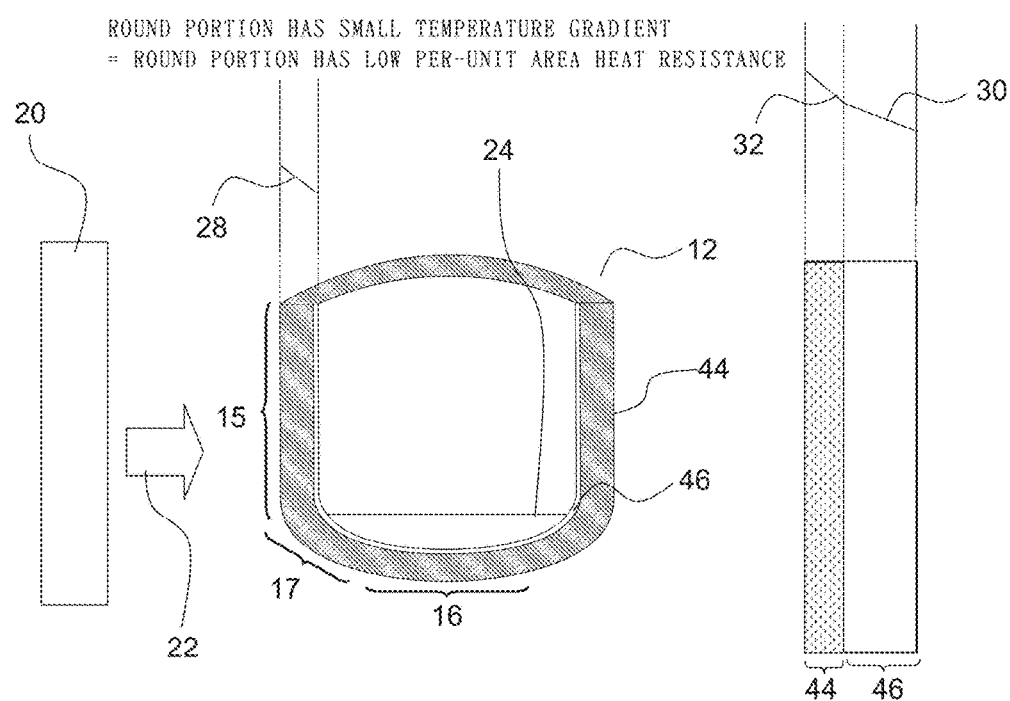

SILICA GLASS CRUCIBLE

TECHNICAL FIELD

The present invention relates to a vitreous silica crucible.

BACKGROUND ART

In recent years, there have been actively developed vitreous silica crucibles which are used to pull a silicon single crystal and can, with a simple structure, prevent the upper end of a sidewall from falling inward. As an example of such a technology, Patent Document 1 discloses a vitreous silica crucible which is used to pull a silicon single crystal and which has a circular groove on the perimeter of a sidewall and above the initial melt line. This groove is provided in a position below the upper end of a carbon susceptor.

There have been also actively developed methods for, when manufacturing a single crystal by the Czochralski method, efficiently and reliably designing pull-up conditions under which solidification is less likely to occur in positions other than the growth interface of the growing single crystal which is being pulled up. As an example of such a technology, Patent Document 2 discloses a method for designing single crystal pulling conditions when growing a single crystal from a raw material melt-containing crucible by the Czochralski method. In this method for designing single crystal pulling conditions, an in-melt average temperature gradient G (K/cm) is obtained by dividing an in-melt temperature difference ΔT (K) between the outer peripheral surface of a single crystal to be grown and the inner wall of the crucible obtained by overall heat transfer analysis by the horizontal distance L (cm) on the melt surface between the outer peripheral surface of the single crystal to be grown and the inner wall of the crucible; and then pulling conditions are set based on the relationship between the in-melt average temperature gradient G and the incidence of solidification which occurs in positions other than the growth interface of the growing single crystal which is being pulled up.

PRIOR ART REFERENCE

Patent Document

[Patent Document 1] Japanese Unexamined Patent Application Publication No. 2008-273788
[Patent Document 2] Japanese Unexamined Patent Application Publication No. 2004-67452

SUMMARY OF THE INVENTION

Problems to be Solved by the Invention

However, the traditional technologies disclosed in the above documents have room for improvement in the following respects.

First, for the vitreous silica crucible disclosed in Patent Document 1, if the user himself or herself provide a susceptor for holding the vitreous silica crucible or if the user himself or herself determines the amount of polycrystalline silicon to be charged into the vitreous silica crucible, it may not be possible to previously form a circular groove in a position above the initial melt line and below the upper end of the carbon susceptor.

Second, for the method disclosed in Patent Document 2, even when pulling conditions are set based on the relationship between the in-melt average temperature gradient G and the incidence of solidification which occurs in positions other than the growth interface of the growing single crystal which is being pulled up, it is difficult to effectively suppress buckling of the crucible or fall of the sidewall into the crucible.

On the other hand, semiconductor chip manufacturing processes where 300 mm-diameter wafers are used have gone mainstream in recent years. Processes where 450 mm-diameter wafers are used are also being developed. To manufacture such wafers, a vitreous silica crucible for use in the CZ method, which is used to manufacture a single crystal silicon ingot, has of course been required to have a large opening diameter of 28 inches (71 cm), 32 inches (81 cm), 36 inches (about 91 cm), or 40 inches (102 cm). The weight of a 102 cm-diameter crucible is as heavy as about 120 kg, and the mass of a silicon melt contained therein is 900 kg or more.

The softening point of vitreous silica is about 1200 to 1300° C. In the CZ method, on the other hand, a silicon single crystal is pulled with a silicon melt maintained at a high temperature of 1450 to 1500° C. over as long as two or more weeks. That is, while the silicon single crystal is pulled, the crucible contains 900 kg or more of the silicon melt having a temperature of about 1500° C. In this case, a heater provided outside the vitreous silica crucible must heat the vitreous silica crucible in order to raise the temperature of the silicon melt to about 1500° C. The heated vitreous silica crucible softens and thus disadvantageously easily buckles or falls.

The pulled silicon single crystal is required to have a purity of 99.999999999% or more. Accordingly, the vitreous silica crucible for pulling silicon single crystal is required not to mix a silica fragment or the like into the silicon single crystal. If the heated vitreous silica crucible softens and thus buckles or falls, a silica fragment may fall, causing a significant problem.

The present invention has been made in view of the foregoing, and an object thereof is to provide a technology which effectively suppresses buckling of a vitreous silica crucible or fall of a sidewall into the crucible.

Means for Solving the Problems

The present invention provides a vitreous silica crucible for pulling single crystal silicon. The vitreous silica crucible includes a cylindrical sidewall having an upward-opening rim, a mortar-shaped bottom including a curve, and a round portion connecting the sidewall and the bottom. A per-unit area thermal resistance in a thickness direction of the sidewall is higher than a per-unit area thermal resistance in a thickness direction of the round portion.

According to this configuration, the per-unit area thermal resistance in the thickness direction of the sidewall is higher than the per-unit area thermal resistance in the thickness direction of the round portion. Thus, while the single crystal silicon is pulled, the degree to which the vitreous silica crucible is heated can be reduced at the point in time when the surface of the silicon melt comes close to the round portion. That is, excessive heating of the sidewall or round portion of the vitreous silica crucible can be suppressed at the point in time when the surface of the silicon melt comes close to the round portion. As a result, buckling of the vitreous silica crucible or fall of the sidewall into the crucible can be suppressed.

Effects of the Invention

According to the present invention, buckling of the vitreous silica crucible or fall of the sidewall into the crucible can be suppressed.

BRIEF DESCRIPTION OF THE DRAWINGS

FIG. 1 is a sectional view showing the configuration of a vitreous silica crucible of a first embodiment.

FIG. 2 is a sectional view showing the temperature gradient of the sidewall of the vitreous silica crucible according to the first embodiment.

FIG. 3 is a sectional view showing the temperature gradient of the round portion of the vitreous silica crucible according to the first embodiment.

FIG. 4 is a sectional view showing the temperature gradient of the sidewall of a vitreous silica crucible according to a second embodiment.

FIG. 5 is a sectional view showing the temperature gradient of the round portion of the vitreous silica crucible according to the second embodiment.

EMBODIMENTS OF THE INVENTION

Hereafter, embodiments of the present invention will be described by use of the drawings. Like components are given like reference signs throughout the drawings and therefore description thereof will be omitted as appropriate.

Vitreous Silica Crucible

FIG. 1 is a sectional view schematically showing the configuration of a vitreous silica crucible. A vitreous silica crucible 12 of the present embodiment includes an inner transparent vitreous silica layer 11 and an outer bubble-containing vitreous silica layer 14. When using the vitreous silica crucible 12 to pull single crystal silicon by the Czochralski method (CZ method) or the like, the vitreous silica crucible 12 is placed on a susceptor (not shown) in such a manner that an opening thereof is oriented upward.

The vitreous silica crucible 12 includes a round portion (may be referred to as "corner") 17 having a relatively large curvature, a cylindrical sidewall 15 having an upward-opening rim, and a mortar-shaped bottom 16 including a straight line or a curve having a relatively small curvature. In the present embodiment, the round portion 17 connects the sidewall 15 and the bottom 16 and refers to a portion between the point at which a tangential line to the curve of the round portion 17 overlaps the sidewall 15 of the vitreous silica crucible 12 and the point at which the round portion 17 has a common tangential line with the bottom 16.

More specifically, the sidewall 15 of the crucible is a cylindrical portion in parallel with the central axis (z-axis) of the crucible and extends approximately directly downward from the opening of the crucible. Note that the sidewall 15 need not necessarily be completely in parallel with the z-axis and may be inclined in such a manner to gradually widen toward the opening. The sidewall 15 may also be linear or gradually curved.

The bottom 16 of the crucible is an approximately discoid portion including a point of intersection with the z-axis of the crucible. The round portion 17 is formed between the bottom 16 and the sidewall 15. The shape of the crucible bottom 16 may be round or flat. The curvature or angle of the round portion 17 may be freely set. If the crucible bottom 16 is round, the bottom 16 has a moderate curvature. Accordingly, the curvature difference between the bottom 16 and the round portion 17 is very small compared to that when the bottom is flat. For example, the point at which the sidewall 15 of the vitreous silica crucible 12 starts to curve may be defined as the boundary between the sidewall 15 and the round portion 17. The portion where the curvature of the crucible bottom is constant may be defined as the bottom 16. The point at which the curvature starts to change when the distance from the center of the crucible bottom is increased may be defined as the boundary between the bottom 16 and the round portion 17.

If the crucible bottom 16 is flat, the bottom 16 forms a flat surface or very gradually curved surface, making the curvature of the round portion 17 very large. Note that the bottom 16 may be defined as a region where the inclination angle of the tangential line to the crucible sidewall with respect to an xy-plane orthogonal to the z-axis is 5 degrees or less, 10 degrees or less, 15 degrees or less, 20 degrees or less, 25 degrees or less, or 30 degrees or less.

When using the vitreous silica crucible 12 thus shaped to pull single crystal silicon by Czochralski method (CZ method) or the like, the sidewall 15 applies a large force to the round portion 17 on the basis of the self-weight 18 thereof. Further, another force works such that the sidewall 15 falls inward. Specifically, in the initial stage of the single crystal silicon pulling process, a silicon melt is contained in the vitreous silica crucible 12 to the extent that the silicon melt reaches an upper portion of the sidewall 15. Accordingly, the silicon melt applies a large pressure to the sidewall 15, the round portion 17, and the bottom 16, thereby suppressing buckling 19 at the round portion 17 or inward fall of the sidewall 15.

However, when the surface of the silicon melt is lowered to around the round portion 17, the silicon melt no longer applies a pressure to the sidewall 15. Furthermore, the silicon melt applies a reduced pressure to the round portion 17 and the bottom 16. On the other hand, a carbon heater (not shown) provided on the perimeter of a mold (not shown) supporting the vitreous silica crucible 12 continues to give a large amount of heat to the sidewall 15. Thus, the sidewall 15 is heated to a high temperature. Since the sidewall 15 thus heated is no longer in contact with the silicon melt, the heat has few escape routes. Thus, the sidewall 15 is heated excessively as if an empty pan were heated, which may soften the vitreous silica to the extent that it has difficulty in supporting the self-weight 18. As a result, the buckling 19 easily occurs at the round portion 17, or the sidewall 15 easily falls inward.

Suppressing Buckling and Fall by Adjusting Temperature Gradient Based on Thickness Difference between Bubble-Containing Vitreous Silica Layers FIG. 2 is a sectional view showing the temperature gradient of the sidewall of the vitreous silica crucible according to the first embodiment. FIG. 3 is a sectional view showing the temperature gradient of the round portion of the vitreous silica crucible according to the first embodiment.

In the present embodiment, the per-unit area thermal resistance in the thickness direction of the sidewall 15 is higher than that of the round portion 17. The per-unit area thermal resistance in the thickness direction of the round portion 17 is higher than that of the bottom 16. As used herein, the thermal resistance refers to a coefficient representing the degree to which, when an object is given heat, it resists the flow of the heat, as shown by the following formula, and is expressed in K/W or ° C./W.

Thermal resistance (° C./$W$)=temperature difference (° C.)÷the amount of heat of heat source ($W$)

Note that in the present embodiment, the per-unit area thermal resistance in the thickness direction is preferably one measured under conditions similar to the conditions under which a silicon single crystal is actually pulled. Specifically, the per-unit area thermal resistance is preferably a value measured under a condition that the ambient temperature outside the vitreous silica crucible is one of 1000° C., 1050° C., 1100° C., 1200° C., 1300° C., 1400° C., 1500° C., 1600° C., 1700° C., 1800° C., 1900° C., and 2000° C. Furthermore, the per-unit area thermal resistance is preferably a value measured under a condition that the ambient temperature inside the vitreous silica crucible is lower than the outside ambient temperature by one of 1° C., 2° C., 3° C., 4° C., 5° C., 6° C., 7° C., 8° C., 9° C., 10° C., 20° C., 30° C., 40° C., 50° C., 60° C., 70° C., 80° C., 90° C., and 100° C.

In the present embodiment, the temperature of the surface 24 of the silicon melt contained in the vitreous silica crucible 12 needs to be maintained in a predetermined range so that single crystal silicon is successfully pulled from the melt surface 24. Since the per-unit area thermal resistance in the thickness direction of the sidewall 15 of the vitreous silica crucible 12 is high in the initial stage of the single crystal silicon pulling process, there is a large temperature difference (temperature gradient 28) between the outside and inside of the sidewall 15, as shown in FIG. 2. For this reason, to maintain the temperature of the melt surface 24 in the predetermined range, the carbon heater 20 provided on the perimeter of the mold (not shown) supporting the vitreous silica crucible 12 needs to supply a large amount of heat 22 to the vitreous silica crucible 12. By doing so, the sidewall 15 is heated to a high temperature and thus easily softens. However, the buckling 19 at the round portion 17 or inward fall of sidewall 15 is suppressed, since the silicon melt is applying a large pressure to the sidewall 15, the round portion 17, and the bottom 16.

When the surface of the silicon melt is then lowered to around the round portion 17, the silicon melt no longer applies a pressure to the sidewall 15. Furthermore, the silicon melt applies a reduced pressure to the round portion 17 and the bottom 16. In the present embodiment, however, the per-unit area thermal resistance in the thickness direction of the round portion 17 of the vitreous silica crucible 12 is lower than that of the sidewall 15. Accordingly, the temperature difference (temperature gradient 28) between the outside and inside of the round portion 17 is reduced, as shown in FIG. 3. For this reason, to maintain the temperature of the melt surface 24 in the predetermined range, the carbon heater 20 provided on the perimeter of the mold (not shown) supporting the vitreous silica crucible 12 only needs to supply a small amount of heat to the round portion 17. As a result, the round portion 17 is prevented from being heated excessively. On the other hand, the sidewall 15 is no longer in contact with the silicon melt and thus the heat has few escape routes. Accordingly, the sidewall 15 is heated as if an empty pan were heated. However, the carbon heater 20 supplies only the small amount of heat and thus the vitreous silica can be avoided from softening to the extent that it has difficulty in supporting the self-weight 18. As a result, the buckling 19 at the round portion 17 or inward fall of the sidewall 15 can be suppressed.

When the surface of the silicon melt is then lowered to around the bottom 16, the silicon melt no longer applies a pressure to the sidewall 15 and the round portion 17. Furthermore, the pressure applied to the bottom 16 by the silicon melt is further reduced. In the present embodiment, however, the per-unit area thermal resistance in the thickness direction of the bottom 16 of the vitreous silica crucible 12 is lower than those of the sidewall 15 and the round portion 17. Accordingly, the temperature difference (temperature gradient) between the outside and inside of the bottom is further reduced. For this reason, to maintain the temperature of the melt surface 24 in the predetermined range, the carbon heater 20 provided on the perimeter of the mold (not shown) supporting the vitreous silica crucible 12 only needs to supply a smaller amount of heat to the bottom 16. Thus, the bottom 16 is prevented from being heated excessively. On the other hand, the sidewall 15 and the round portion 17 are no longer in contact with the silicon melt and thus the heat has few escape routes. Accordingly, the sidewall 15 and the round portion 17 are heated as if an empty pan were heated. However, the carbon heater 20 supplies only the smaller amount of heat, which can avoid the vitreous silica from softening to the extent that it has difficulty in supporting the self-weight 18. As a result, the buckling 19 at the round portion 17 or inward fall of the sidewall 15 can be suppressed.

The structure of the vitreous silica crucible 12 satisfying these conditions is not limited to a particular one, since various structures are conceivable. Examples of the structure includes a structure where, as shown in FIGS. 2 and 3, the vitreous silica crucible 12 has two or more layers including the bubble-containing vitreous silica layer 14 and the transparent vitreous silica layer 11; the bubble-containing vitreous silica layer 14 of the sidewall 15 is larger in thickness than the bubble-containing vitreous silica layer 14 of the round portion 17; and the bubble-containing vitreous silica layer 14 of the round portion 17 is larger in thickness than the bubble-containing vitreous silica layer 14 of the bottom 16. Since the bubble-containing vitreous silica layer 14 has a high per-unit area thermal resistance, there is a large temperature difference (temperature gradient 32) between the outside and inside of the bubble-containing vitreous silica layer 14. Since the transparent vitreous silica layer 11, on the other hand, has a lower per-unit area thermal resistance than the bubble-containing vitreous silica layer 14, there is a smaller temperature difference (temperature gradient 30) between the outside and inside of the transparent vitreous silica layer 11. For this reason, if the bubble-containing vitreous silica layer 14 of the sidewall 15 has a large thickness, there is a large temperature difference (temperature gradient 28) between the outside and inside of the entire sidewall 15, as shown in FIG. 2.

On the other hand, if the bubble-containing vitreous silica layer 14 of the round portion 17 is smaller in thickness than that of the sidewall 15, the temperature difference (temperature gradient 28) between the outside and inside of the entire round portion 17 is smaller than that of the sidewall 15, as shown in FIG. 3. Furthermore, if the bubble-containing vitreous silica layer 14 of the bottom 16 is smaller in thickness than that of the round portion 17, the temperature difference (temperature gradient) between the outside and inside of the entire bottom 16 is smaller than that of the round portion 17. Accordingly, the vitreous silica crucible 12 satisfying the above conditions can be obtained as long as the bubble-containing vitreous silica layer 14 of the sidewall 15 is larger in thickness than the bubble-containing vitreous silica layer 14 of the round portion 17 and as long as the bubble-containing vitreous silica layer 14 of the round portion 17 is larger in thickness than the bubble-containing vitreous silica layer 14 of the bottom 16.

Suppressing Buckling and Fall by Adjusting Temperature Gradient Using Dissimilar Materials FIG. 4 is a sectional view showing the temperature gradient of the sidewall of a vitreous silica crucible according to a second embodiment. FIG. 5 is a sectional view showing the temperature gradient of the round portion of the vitreous silica crucible according to the second embodiment.

In the present embodiment, as shown in FIGS. 4 and 5, the vitreous silica crucible 12 has two or more layers including dissimilar materials having different thermal conductivities. Specifically, of the two or more layers, an outer layer 44 contains aluminum as an impurity and therefore has a high per-unit area thermal resistance. The outer layer 44 containing aluminum as an impurity is obtained by arc-fusing a natural silica powder-alumina powder mixed material in a mold when manufacturing the vitreous silica crucible 12. Of the two or more layers, an inner layer 46 contains nitrogen as an impurity and therefore has a low per-unit area thermal resistance. The inner layer 46 containing nitrogen as an impurity is obtained by arc-fusing synthetic silica powder in a nitrogen gas or ammonia gas atmosphere.

In the example shown in FIGS. 4 and 5, the vitreous silica crucible 12 has two or more layers including dissimilar materials having different thermal conductivities; the outer layer 44 of the sidewall 15 is larger in thickness than the outer layer 44 of the round portion 17; and the outer layer 44 of the round portion 17 is larger in thickness than the outer layer 44 of the bottom 16. Since the outer layer 44 has a high per-unit area thermal resistance, there is a large temperature difference (temperature gradient 32) between the outside and inside of the outer layer 44. Since the inner layer 46, on the other hand, has a lower per-unit area thermal resistance than the outer layer 44, there is a small temperature difference (temperature gradient 30) between the outside and inside of the inner layer 46. For this reason, if the outer layer 44 of the sidewall 15 has a large thickness, there is a large temperature difference (temperature gradient 28) between the outside and inside of the entire sidewall 15, as shown in FIG. 4.

On the other hand, if the outer layer 44 of the round portion 17 is smaller in thickness than that of the sidewall 15, the temperature difference (temperature gradient 28) between the outside and inside of the entire round portion 17 is smaller than that of the sidewall 15, as shown in FIG. 5. Furthermore, if the outer layer 44 of the bottom 16 is smaller in thickness than that of the round portion 17, the temperature difference (temperature gradient) between the outside and inside of the entire bottom 16 is smaller than that of the round portion 17. Accordingly, the vitreous silica crucible 12 satisfying the above conditions can be obtained as long as the outer layer 44 of the sidewall 15 is larger in thickness than that of the round portion 17 and as long as the outer layer 44 of the round portion 17 is larger in thickness than that of the bottom 16.

While the embodiments of the present invention have been described with reference to the drawings, the embodiments are illustrative only. Various configurations other than those described above can be employed.

DESCRIPTION OF REFERENCE SIGNS 11 transparent vitreous silica layer
12 vitreous silica crucible
14 bubble-containing vitreous silica layer
15 sidewall
16 bottom
17 round portion
18 self-weight
19 buckling
20 carbon heater
22 the amount of heat
24 liquid surface
28 temperature gradient
30 temperature gradient
32 temperature gradient
44 outer layer
46 inner layer

The invention claimed is:

1. A vitreous silica crucible for pulling single crystal silicon, comprising:
   a cylindrical vertical sidewall having an upward-opening rim;
   a mortar-shaped bottom including a curve; and
   a round portion connecting the sidewall and the bottom, wherein
   a per-unit area thermal resistance in a thickness direction of the sidewall is higher than a per-unit area thermal resistance in a thickness direction of the round portion, and the per-unit area thermal resistance in the thickness direction of the round portion is higher than a per-unit area thermal resistance in a thickness direction of the bottom,
   wherein when all layers constituting the vitreous silica crucible are divided into a continuous inner layer and a continuous outer layer,
   the outer layer has a higher per-unit thermal resistance than that of the inner layer,
   the outer layer in the sidewall is thicker than the outer layer at the round portion,
   the outer layer is thicker than the inner layer in the sidewall, and
   the outer layer is thinner than the inner layer at the round portion.

2. The vitreous silica crucible of claim 1, wherein the outer layer includes a bubble-containing vitreous silica layer and the inner layer includes a transparent vitreous silica layer.

3. The vitreous silica crucible of claim 2, wherein the bubble-containing vitreous silica layer of the round portion is larger in thickness than the bubble-containing vitreous silica layer of the bottom.

4. The vitreous silica crucible of claim 1, wherein the outer and inner layers are made of dissimilar materials having different thermal conductivities.

5. The vitreous silica crucible of claim 4, wherein the outer layer contains aluminum as an impurity.

6. The vitreous silica crucible of claim 4, wherein the inner layer contains nitrogen as an impurity.

* * * * *